US010228660B2

(12) United States Patent
Maesawa et al.

(10) Patent No.: US 10,228,660 B2
(45) Date of Patent: Mar. 12, 2019

(54) ELECTRONIC APPARATUS AND CONTROL METHOD

(71) Applicant: SEIKO INSTRUMENTS INC., Chiba-shi, Chiba (JP)

(72) Inventors: Tamotsu Maesawa, Chiba (JP); Kazumi Sakumoto, Chiba (JP); Keisuke Tsubata, Chiba (JP); Tetsuya Nobe, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 15/122,619

(22) PCT Filed: Nov. 18, 2014

(86) PCT No.: PCT/JP2014/080408
§ 371 (c)(1),
(2) Date: Aug. 30, 2016

(87) PCT Pub. No.: WO2015/133013
PCT Pub. Date: Sep. 11, 2015

(65) Prior Publication Data
US 2017/0075310 A1    Mar. 16, 2017

(30) Foreign Application Priority Data
Mar. 3, 2014  (JP) ................. 2014-040129

(51) Int. Cl.
| | |
|---|---|
| *G04C 10/02* | (2006.01) |
| *H02J 7/35* | (2006.01) |
| *H02S 40/38* | (2014.01) |
| *G04G 19/00* | (2006.01) |
| *G04G 21/04* | (2013.01) |

(52) U.S. Cl.
CPC ............. *G04C 10/02* (2013.01); *G04G 19/00* (2013.01); *G04G 21/04* (2013.01); *H02J 7/35* (2013.01); *H02S 40/38* (2014.12)

(58) Field of Classification Search
CPC ........ G04C 10/02; G04G 19/00; G04G 21/04; H02S 40/38; H02J 7/35
USPC ............................................. 136/252
See application file for complete search history.

(56) References Cited

U.S. PATENT DOCUMENTS

| 4,240,021 | A | * | 12/1980 | Kashima | ............... | G04C 10/02 |
| | | | | | | 136/291 |
| 4,571,532 | A | * | 2/1986 | Jaster | ...................... | H02J 7/35 |
| | | | | | | 136/293 |
| 5,886,954 | A | | 3/1999 | Asami et al. | ................... | 368/67 |

OTHER PUBLICATIONS

International Search Report dated Dec. 22, 2014 issued in International Application No. PCT/JP2014/080408.

(Continued)

*Primary Examiner* — Jayne L Mershon
(74) *Attorney, Agent, or Firm* — Adams & Wilks

(57) ABSTRACT

A proposed electronic apparatus is capable of charging a secondary battery and performing data communication using a solar cell while suppressing effects of ambient light even when the intensity of light radiated to the solar cell is low. The electronic apparatus includes a control circuit 202 and a resistance 205. The control circuit 202 receives data based on an output voltage of a solar cell 201. The resistance 205 is connected between electrodes of the solar cell 201. The control circuit 202 controls a resistance value of the resistance 205 based on whether during an operation of receiving data or not.

15 Claims, 5 Drawing Sheets

(56) References Cited

OTHER PUBLICATIONS

Abstract, Publication No. 2001-099964, Publication Date Apr. 13, 2001.

* cited by examiner

10 EXTERNAL DATA TRANSMISSION DEVICE
20 ELECTRONIC TIMEPIECE

202 CONTROL CIRCUIT
203 CHARGE CONTROL CIRCUIT
207 EXTERNAL INPUT UNIT
208 DISPLAY UNIT

2034 REFERENCE VOLTAGE CIRCUIT

S101 INPUT FOR INSTRUCTING CHANGE INTO COMMUNICATION MODE EXISTS?
S102 SHIFT TO COMMUNICATION MODE
S103 ENABLE CONTROL TERMINAL
S104 COMPLETE RECEPTION OF DATA SIGNAL?
S105 PROCESS RECEIVED SIGNAL
S106 SHIFT TO NORMAL MODE
S107 DISABLE CONTROL TERMINAL

202 CONTROL CIRCUIT
203 CHARGE CONTROL CIRCUIT
207 EXTERNAL INPUT UNIT
208 DISPLAY UNIT

S201 INPUT FOR INSTRUCTING CHANGE TO COMMUNICATION MODE EXISTS?
S202 SHIFT TO COMMUNICATION MODE
S203 ENABLE CONTROL TERMINAL 1
S204 STATE EQUAL TO OR HIGHER THAN Vth CONTINUES FOR PREDETERMINED PERIOD OF TIME OR MORE?
S205 ENABLE CONTROL TERMINAL 2
S206 COMPLETE RECEPTION OF DATA SIGNAL?
S207 PROCESS RECEIVED SIGNAL
S206 SHIFT TO NORMAL MODE
S207 DISABLE CONTROL TERMINALS 1 AND 2

ELECTRONIC APPARATUS AND CONTROL METHOD

TECHNICAL FIELD

The present invention relates to an electronic apparatus and a control method.

The invention claims a priority based on the Japanese Patent Application No. 2014-040129 filed on Mar. 3, 2014, the contents of which are cited in this document.

BACKGROUND ART

In a related-art electronic timepiece having a solar cell, there is proposed a technique of normally executing a normal operation mode in which a secondary battery is charged by the solar cell, shifting to a data transfer mode when set in a predetermined operation state by a user's operation, receiving an optical signal from an external device by using the solar cell and writing the received data in a data storage circuit thereinside (for example, see Patent Literature 1).

CITATION LIST

Patent Literature

Patent Literature 1: JP-A-2001-99964

SUMMARY OF INVENTION

Technical Problem

It is necessary to connect a resistance between electrodes of the solar cell when performing data communication using the solar cell for avoiding a state where communication is not performed due to effects of ambient light. However, when the resistance is connected between electrodes of the solar cell, an output voltage of the solar voltage is reduced as compared with a case where the resistance is not connected. Therefore, there is a problem that it is difficult to generate a voltage necessary for charging the secondary battery when the intensity of light radiated to the solar cell is low.

Accordingly, the invention has been made in view of the above circumstances, and an object thereof is to provide an electronic apparatus and a control method capable of charging the secondary battery and capable of performing data communication using the solar cell while suppressing effects of ambient light even when the intensity of light radiated to the solar cell is low.

Solution to Problem

According to an embodiment of the invention, there is provided an electronic apparatus including a solar cell, a receiving unit receiving data based on an output voltage of the solar cell, a resistance connected between electrodes of the solar cell and a controller controlling a resistance value of the resistance based on whether the receiving unit is during an operation of receiving the data or not.

In the electronic apparatus according to another aspect of the invention, the controller may cut off connection of the resistance when the receiving unit is not during the operation of receiving data.

In the electronic apparatus according to another aspect of the invention, the controller may control the resistance value of the resistance in accordance with the output voltage of the solar cell.

In the electronic apparatus according to another aspect of the invention, the controller may reduce the resistance value of the resistance in the case where the output voltage of the solar cell is higher than a fixed value for a predetermined period of time or more.

According to the embodiment of the invention, there is provided a control method including the steps of receiving data based on an output voltage of a solar cell and controlling a resistance value of a resistance connected between electrodes of the solar cell based on whether during an operation of receiving the data or not in the receiving step.

Advantageous Effects of Invention

According to some of the embodiments of the invention, the receiving unit receives data based on the output voltage of the solar cell. The controller controls the resistance value of the resistance connected between electrodes of the solar cell based on whether the receiving unit is during the operation of receiving the data or not. Accordingly, the electronic timepiece can charge the secondary battery and perform data communication using the solar cell while suppressing effects of ambient light even when the intensity of light radiated to the solar cell is low.

DESCRIPTION OF EMBODIMENTS

Hereinafter, embodiments of the invention will be explained with reference to the drawings. The same symbols are given to the same components in respective drawings.

First Embodiment

Figure 1:
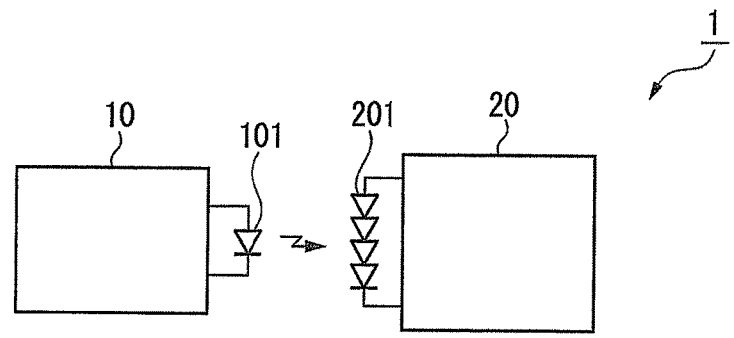
FIG. 1 is a schematic diagram showing a configuration of a data communication system according to a first embodiment of the invention.

First, a first embodiment of the invention will be explained. FIG. 1 is a schematic diagram showing a configuration of a data communication system 1 according to the embodiment. In the shown example, the data communication system 1 includes an external data transmission device 10 and an electronic timepiece 20. The external data transmission device 10 is an electronic apparatus such as a smart phone, a cellular phone device or a tablet terminal, which is provided with a light emitting diode 101. The electronic timepiece 20 includes a solar sell 201.

The external data transmission device 10 controls lighting-on and lighting-off of the light emitting diode 101, transmitting data by using light. For example, the external data transmission device 10 turns on the light emitting diode 101 when transmitting data "1", and turns off the light emitting diode 101 when transmitting data "0". The electronic timepiece 20 receives data based on an output voltage of the solar cell 201. For example, when the light emitting diode 101 of the external transmission device 10 is turned on, the solar cell 201 generates an output voltage corresponding to light of the light emitting diode 101. Therefore, the electronic timepiece 20 receives data "1" when the output voltage of the solar cell 201 is equal to or higher than a predetermined threshold, and receives data "0" when the output voltage of the solar cell 201 is lower than the predetermined threshold. The data transmitted by the external data transmission device 10 may be any data such as time information.

Figure 2:
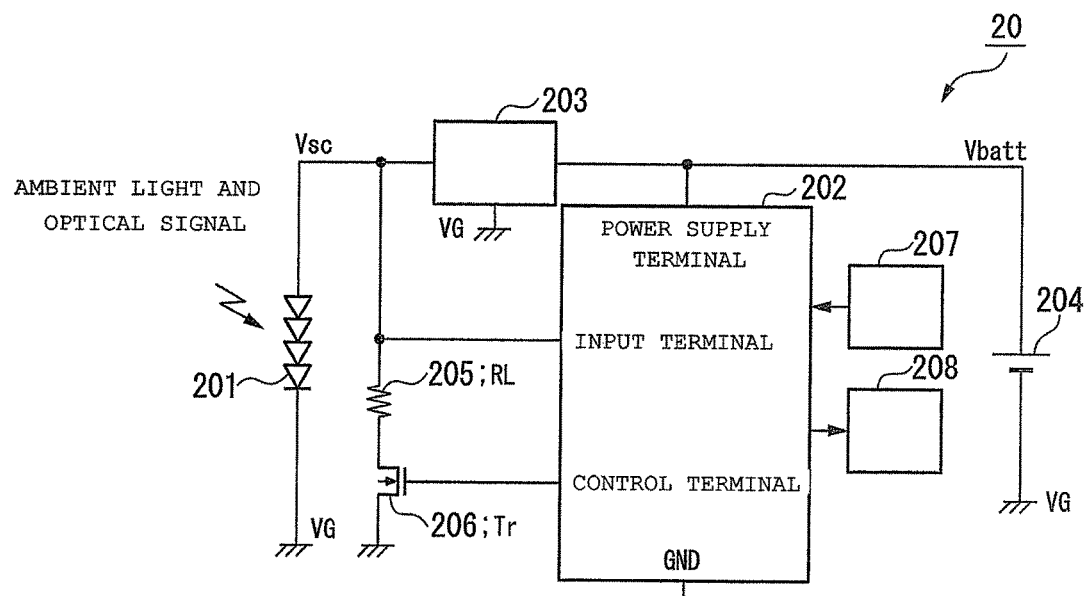
FIG. 2 is a schematic diagram showing a configuration of an electronic timepiece according to the first embodiment.

Next, a configuration of the electronic timepiece 20 will be explained. FIG. 2 is a schematic diagram showing a configuration of the electronic timepiece 20 according to the embodiment. In the shown example, the electronic timepiece 20 includes a solar cell 201, a control circuit 202, a charge control circuit 203, a secondary battery 204, a resistance 205, a transistor 206, an external input unit 207 and a display unit 208.

The solar cell 201 functions as a power generator which receives light of an external light source (sun, illumination and so on) and converts the light into electrical energy in a charging period as well as functions as a light receiver for performing optical communication with the external data transmission device 10 in a communication period. A potential of a negative terminal of the solar cell 201 is taken as a reference potential. The resistance 205 is provided between electrodes which make a pair of a positive terminal and the negative terminal of the solar cell 201, which is configured to connect to the solar cell 201 in parallel. In the transistor 206, a source terminal is grounded and a drain is connected to one end of the resistance 205. In short, the transistor 206 is connected between the resistance 205 and the ground (GND). According to the configuration, a connecting state of the resistance 205 provided between electrodes of the solar cell 201 can be controlled by switching the transistor 206 between ON-state and OFF-state.

The control circuit 202 (controller) controls respective components included in the electronic timepiece 20. The control circuit 202 operates as a communication unit (receiving unit). Specifically, the control circuit 202 detects an output voltage of the solar cell 201 inputted into an input terminal in a communication mode (during operation of receiving data), and receives data transmitted by optical communication from the external device (in this case, the external data transmission device 10) by converting the detected voltage into an electrical signal. The control circuit 202 controls ON/OFF of the transistor 206 through a control terminal and controls connection of the resistance 205 connected between electrodes of the solar cell 201. A method of connecting the resistance 205 will be described later.

The external input unit 207 is, for example, a switch and so on, receiving an operation input from the outside. A display unit 208 is, for example, a liquid crystal display and so on, displaying information such as time.

Figure 3:
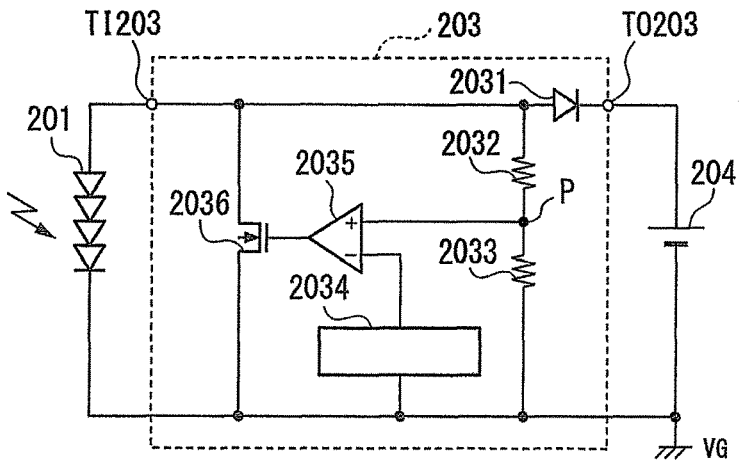
FIG. 3 is a circuit diagram showing a circuit example of a charge control circuit according to the first embodiment.

The charge control circuit 203 controls charging to the secondary battery 204 by the solar cell 201 and controls prevention of overcharge in the secondary battery 204. FIG. 3 is a circuit diagram showing a configuration example of the charge control circuit 203. In the shown example, the charge control circuit 203 includes a diode device 2031, resistances 2032, 2033, a reference voltage circuit 2034, a comparator unit 2035 and a transistor 2036.

In the shown example, the positive terminal of the solar cell 201 is connected to an input terminal TI 203 of the charge control circuit 203, and a positive terminal of the secondary battery 204 is connected to an output terminal TO203 of the charge control circuit 203, respectively. A reference potential of the charge control circuit 203 is configured to be a potential VG which is common to the negative terminal of the solar cell 201 and a negative terminal of the secondary battery. An anode terminal of the diode device 2031 is connected to the input terminal TI203 of the charge control circuit 203. A cathode terminal of the diode device 2031 is connected to the output terminal TO203 of the charge control circuit 203. According to the configuration, the charge control circuit 203 allows electric current to flow from the positive terminal of the solar cell 201 toward the positive terminal of the secondary battery 204, whereas, the charge control circuit 203 prevents electric current from flowing from the positive terminal of the secondary battery 204 toward the positive terminal of the solar cell 201.

The resistance 2032 and the resistance 2033 are connected in series through a connection point P. The other terminal of the resistance 2032 which is different from the connection point P is connected to the input terminal TI203 of the charge control circuit 203, and the other terminal of the resistance 2033 which is different from the connection point P becomes the common potential VG. According to the configuration, respective resistance values of the resistance 2032 and the resistance 2033 are set so that the potential of the connection point P is a potential obtained by dividing the output voltage (Vsc) of the solar cell 201 by the resistance 2032 and the resistance 2033 so as to be a voltage comparable with a reference voltage of the later-described reference voltage circuit 2034.

One terminal of an input terminal (a non-inverting input) of the comparator unit 2035 is connected to the connection point P, and the other end (an inverting input) of the input terminal is connected to an output terminal of the reference voltage circuit 2034. An output terminal of the comparator unit 2035 is connected to a gate terminal of the transistor 2036. A drain terminal of the transistor 2036 is connected to an input terminal TI203 of the charge control circuit 203, and a source terminal becomes the common potential VG. In short, the drain terminal of the transistor 2036 is connected to the positive terminal of the solar cell 201 and the source terminal is connected to the negative terminal of the solar cell 201.

The reference voltage circuit 2034 outputs a reference voltage not affected by variations of the output voltage of the solar cell 201, and supplies a reference voltage Vref to the comparator unit 2035. The comparator unit 2035 receives the reference voltage Vref, comparing a voltage VC obtained by dividing the output voltage of the solar battery 210 by the resistance 2032 and the resistance 2033 with the reference voltage Vref. The comparator unit 2035 outputs a voltage corresponding to the comparison result from an output terminal. As a result of comparison, the comparator unit 2035 applies a voltage for allowing the transistor 2036 to be ON-state when the voltage VC exceeds the reference voltage Vref (VC>Vref), and applies a voltage for allowing the transistor 2036 to be OFF-state when the voltage VC does not exceed the reference voltage Vref (VC≤Vref) to the gate of the transistor 2036 from the output terminal.

Accordingly, when the voltage VC exceeds the reference voltage Vref, namely, when the output voltage of the solar cell 201 is higher than a predetermined voltage, electric current flows in the transistor 2036. In this case, the voltage is reduced due to an internal impedance of the solar cell 201, and the output voltage of the solar cell 201 is reduced. Accordingly, the output voltage of the solar cell 201 can be reduced to be lower than an upper-limit voltage of the secondary battery 204, and overcharge of the secondary battery 204 can be prevented.

The state in which electric current flows in the transistor 2036 may be a state where electric current flows while limiting a current value by a given internal impedance of the transistor 2036, which is not required to be a complete ON-state. In that case, the internal impedance of the transistor 2036 is adjusted so that the output voltage of the solar cell 201 becomes lower than the upper-limit of the secondary battery 204.

Next, a method of controlling connection of the resistance 205 connected between electrodes of the solar cell 201 by the control circuit 202 will be explained. The output voltage of the solar cell 201 varies according to the intensity of received light. When the intensity of light is higher than a fixed value, the output voltage of the solar cell 201 becomes a fixed upper-limit value due to the function of the charge control circuit 203 even when the intensity of light varies. Accordingly, when the intensity of ambient light is strong and light with a fixed intensity or higher than that is constantly radiated to the solar cell 201, the output voltage of the solar cell 201 does not vary while keeping the fixed upper-limit value even when the external data transmission device 10 turns on and turns off the light emitting diode 101.

Accordingly, in the embodiment, the control circuit 202 connects the resistance 205 between electrodes of the solar cell 201 in the operation (communication mode) of receiving data from the external data transmission device 10 by the electronic timepiece 20 to allow the output voltage of the solar cell 201 to be higher than a predetermined threshold only when the solar cell 201 receives light higher than ambient light. Therefore, for example, a resistance value of the resistance 205 is set to a value in which the output voltage of the solar cell 201 becomes higher than the predetermined threshold only when light higher than ambient light is received by connecting the resistance 205 between electrodes of the solar cell 201.

On the other hand, when the resistance 205 is connected between electrodes of the solar cell 201, the output voltage of the solar cell 201 becomes lower than the predetermined threshold even when the ambient light is received. Accordingly, the solar cell 201 is not able to charge the secondary battery 204 until it is overcharged even when ambient light is received. Accordingly, the control circuit 202 cuts off connection of the resistance 205 between electrodes of the solar cell 201 not in the operation of receiving data from the external data transmission device 10 by the electronic timepiece 20 (in the normal mode) in the embodiment.

Figure 4:
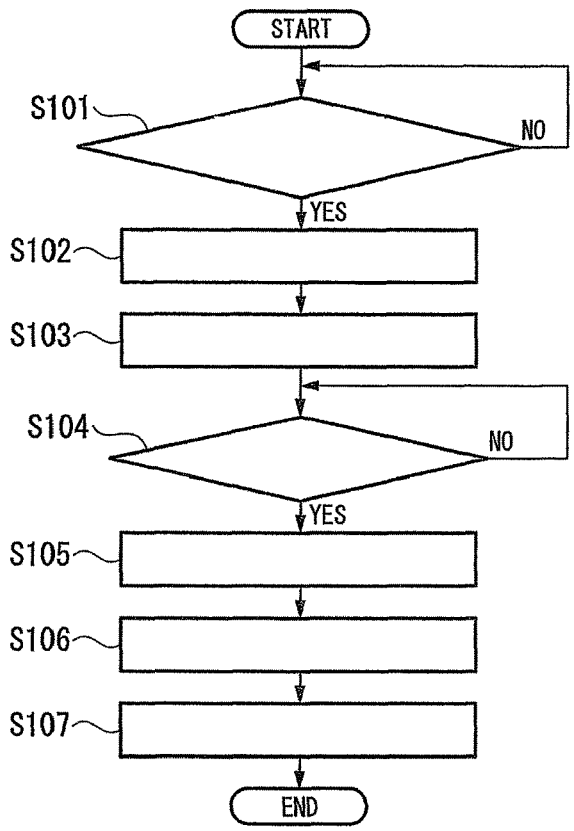
FIG. 4 is a flowchart showing operation procedures of the electronic timepiece according to the first embodiment.

Next, operation procedures of the electronic timepiece 20 will be explained. FIG. 4 is a flowchart showing operation procedures of the electronic timepiece 20 according to the embodiment.

(Step S101) A user operates the external input unit 207 and inputs an instruction to change into the communication mode when data transmitted from the external data transmission device 10 is allowed to be received by the electronic timepiece 20. The control circuit 202 determines whether the external input unit 207 receives the input for instructing change into the communication mode or not. When the control circuit 202 determines that the input for instructing change into the communication mode has been received, the process proceeds to Step S102, and the process of Step S101 is repeated again in other cases.

(Step S102) The control circuit 202 shifts the operation mode of the electronic timepiece 20 to the communication mode. After that, the process proceeds to Step S103.

(Step S103) The control circuit 202 enables a control terminal and turns on the transistor 206. That is, the control circuit 202 connects the resistance 205 between electrodes of the solar cell 201. After that, the process proceeds to Step S104.

(Step S104) The control circuit 202 detects an output voltage of the solar cell 201 inputted to the input terminal and converts the detected voltage into an electrical signal, thereby receiving data transmitted from the external data transmission device 10 by optical communication. When the reception of data is completed, the process proceeds to Step S105, and when the reception is not completed, the process of Step S104 is continuously executed.

(Step S105) The control circuit 202 performs processing of data received in the process of Step S104. After that, the process proceeds to Step S106.

(Step S106) The control circuit 202 switches the operation mode of the electronic timepiece 20 to the normal mode. After that, the process proceeds to Step S107.

(Step S107) The control circuit 202 disables the control terminal and turns off the transistor 206. That is, the control circuit 202 cuts off the connection of the resistance 205 between the electrodes of the solar battery 201. After that, the process ends.

As described above, according to the embodiment, the electronic timepiece 20 operates in the communication mode in which reception of data transmitted from the external data transmission device 10 by optical communication is performed and in the normal mode in which reception of data is not performed. The control circuit 202 connects the resistance 205 between electrodes of the solar cell 201 when operating in the communication mode. The control circuit 202 cuts off the connection of the resistance 205 between electrodes of the solar cell 201 when operating in the normal mode.

Accordingly, the electronic timepiece 20 detects the output voltage of the solar cell 201 inputted into the input terminal and converts the detected voltage into an electrical signal to thereby receive data transmitted from the external data transmission device 10 by optical communication regardless of effects of ambient light at the time of operating in the communication mode. The electronic timepiece 20 can charge the secondary battery 204 by ambient light at the time of operating in the normal mode. That is, the electronic timepiece 20 can charge the secondary battery 204 and perform data communication using the solar cell 201 while suppressing effects of ambient light even when the intensity of light radiated to the solar cell 201 is low.

Second Embodiment

Next, a second embodiment of the invention will be explained. This embodiment differs from the first embodiment in a point that a resistance value of the resistance connected between electrodes of the solar cell 201 can be changed.

Figure 5:
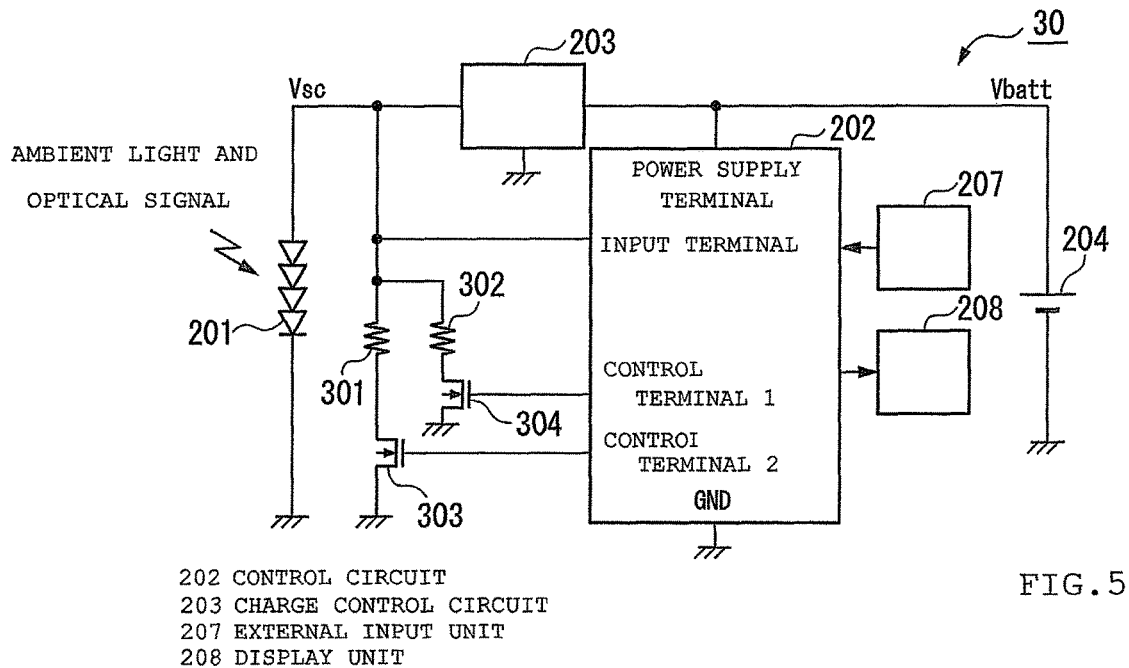
FIG. 5 is a schematic diagram showing a configuration of an electronic timepiece according to a second embodiment.

FIG. 5 is a schematic diagram showing a configuration of an electronic timepiece 30 according to the embodiment. In the shown example, the electronic timepiece 30 includes the solar cell 201, the control circuit 202, the charge control circuit 203, the secondary battery 204, resistances 301, 302, transistors 303, 304, the external input unit 207 and the display unit 208. The solar cell 201, the control circuit 202, the charge control circuit 203, the secondary battery 204, the external input unit 207 and the display unit 208 are the same as respective components of the first embodiment.

The resistances 301 and 302 are connected between electrodes of the solar cell 201 in parallel. The transistor 303 is connected between the resistance 301 and the ground (GND). The transistor 304 is connected between the resistance 302 and the ground (GND). According to the configuration, it is possible to control connection of the resistance 301 connected between the electrodes of the solar cell 201 by turning on/off the transistor 303. It is also possible to control connection of the resistance 302 connected between electrodes of the solar cell 201 by turning on/off the transistor 304.

Next, a method of controlling connection of the resistances 301 and 302 connected between electrodes of the solar cell 201 by the control circuit 202 will be explained. When the intensity of ambient light is high, an output voltage of the solar cell 201 is constantly equal to or higher than a threshold Vth even when only the resistance 301 is connected between electrodes of the solar cell 201. Accordingly, when the external data transmission device 10 turns on and turns off the light emitting diode 101, the output voltage of the solar cell 201 does not vary while keeping the threshold value Vth in the case where the intensity of ambient light is high even when only the resistance 301 is connected between electrodes of the solar cell 201.

Figure 6:
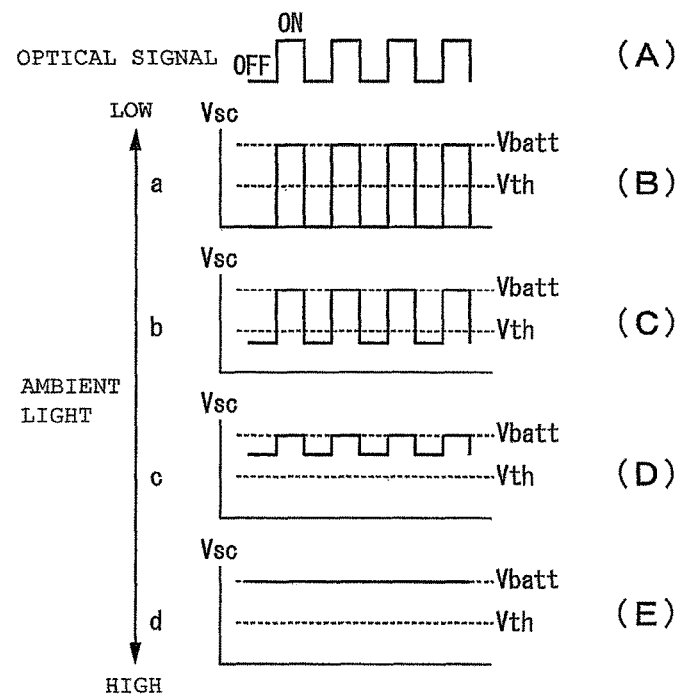
FIG. 6 is a schematic view showing output voltages of the solar cell when receiving an optical signal transmitted by an external data transmission device in the second embodiment.

FIG. 6 is a schematic view showing output voltages of the solar cell 201 when receiving an optical signal transmitted by the external data transmission device 10 in the case where only the resistance 301 is connected between electrodes of the solar cell 201 in the embodiment. The control circuit 202 determines that data "1" has been received when the output voltage of the solar cell 201 is equal to or higher than the threshold Vth, and determines that data "0" has been received when the output voltage of the solar cell 201 is lower than the threshold Vth. The intensity of ambient light is represented by a<b<c<d. That is, an intensity "a" is the lowest and an intensity "d" is the highest. Vbatt denotes a voltage outputted when the secondary battery 204 is overcharged.

A graph (A) shows an intensity of the optical signal transmitted by the external data transmission device 10. In the shown example, the optical signal is a signal repeating ON and OFF alternately. That is, the external transmission device 10 turns on the light emitting diode 101 when the device is ON, and turns off the light emitting diode 101 when the device is OFF.

A graph (B) is a graph showing an output voltage of the solar cell 201 when receiving the optical signal transmitted by the external data transmission device 10 in the case where the intensity of ambient light is "a". In the shown example, when the light emitting diode 101 of the external data transmission device 10 is turned on, the output voltage of the solar cell 201 is equal to or higher than the threshold Vth. When the light emitting diode 101 of the external data transmission device 10 is turned off, the output voltage of the solar cell 201 is lower than the threshold Vth. Accordingly, when the intensity of ambient light is "a", the electronic timepiece 30 can receive the optical signal transmitted from the external data transmission device 10.

A graph (C) is a graph showing an output voltage of the solar cell 201 when receiving the optical signal transmitted by the external data transmission device 10 in the case where the intensity of ambient light is "b". In the shown example, when the light emitting diode 101 of the external data transmission device 10 is turned on, the output voltage of the solar cell 201 is equal to or higher than the threshold Vth. When the light emitting diode 101 of the external data transmission device 10 is turned off, the output voltage of the solar cell 201 is lower than the threshold Vth. Accordingly, when the intensity of ambient light is "b", the electronic timepiece 30 can receive the optical signal transmitted from the external data transmission device 10.

A graph (D) is a graph showing an output voltage of the solar cell 201 when receiving the optical signal transmitted by the external data transmission device 10 in the case where the intensity of ambient light is "c". In the shown example, when the light emitting diode 101 of the external data transmission device 10 is turned on, the output voltage of the solar cell 201 is equal to or higher than the threshold Vth. When the light emitting diode 101 of the external data transmission device 10 is turned off, the output voltage of the solar cell 201 is also equal to or higher than the threshold Vth. Accordingly, when the intensity of ambient light is "c", it is difficult for the electronic timepiece 30 to receive the optical signal transmitted from the external data transmission device 10.

A graph (E) is a graph showing an output voltage of the solar cell 201 when receiving the optical signal transmitted by the external data transmission device 10 in the case where the intensity of ambient light is "d". In the shown example, when the light emitting diode 101 of the external data transmission device 10 is turned on, the output voltage of the solar cell 201 is equal to or higher than the threshold Vth. When the light emitting diode 101 of the external data transmission device 10 is turned off, the output voltage of the solar cell 201 is also equal to or higher than the threshold Vth. Accordingly, when the intensity of ambient light is "d", it is difficult for the electronic timepiece 30 to receive the optical signal transmitted from the external data transmission device 10.

As described above, when the intensity of ambient light is high, there may be a case where the electronic timepiece 30 is not able to receive the optical signal transmitted from the external data transmission device 10 even if only the resistance 301 is connected between the electrodes of the solar cell 201.

Accordingly, when the intensity of ambient light is high, the resistance 301 and the resistance 302 are connected in parallel between electrodes of the solar cell 201 in the embodiment. That is, the resistance value of the resistance connected between electrodes of the solar cell 201 is reduced.

Figure 7:
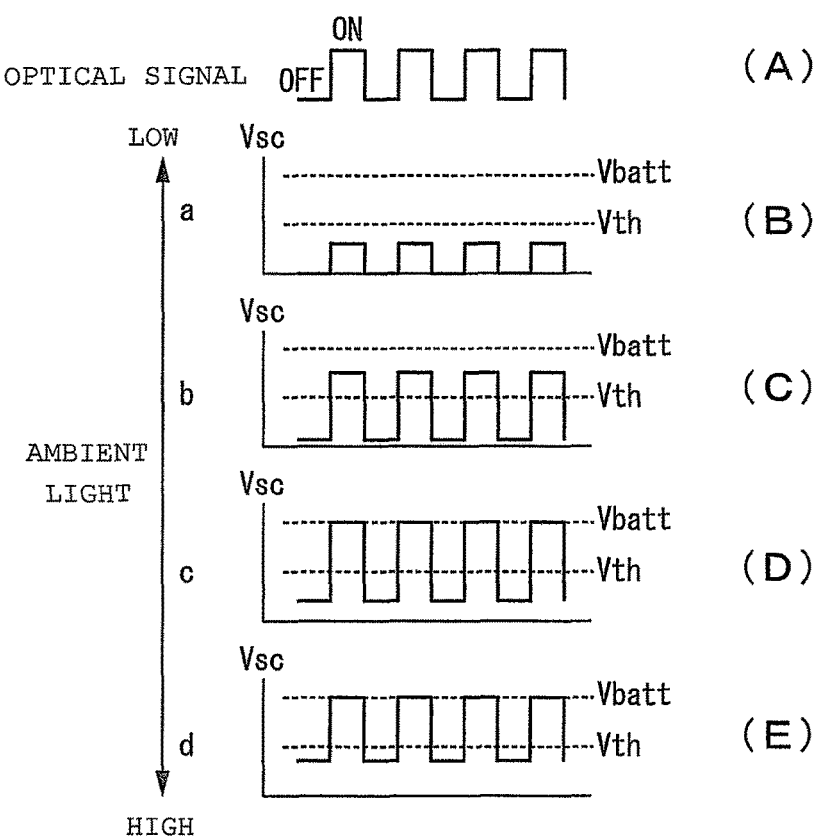
FIG. 7 is a schematic view showing output voltages of the solar cell when receiving an optical signal transmitted by the external data transmission device in the second embodiment.

FIG. 7 is a schematic view showing output voltages of the solar cell 201 when receiving an optical signal transmitted by the external data transmission device 10 in the case where the resistance 301 and the resistance 302 are connected in parallel between electrodes of the solar cell 201 in the embodiment. The control circuit 202 determines that data "1" has been received when the output voltage of the solar cell 201 is equal to or higher than the threshold Vth, and determines that data "0" has been received when the output voltage of the solar cell 201 is lower than the threshold Vth. The intensity of ambient light is represented by a<b<c<d. That is, an intensity "a" is the lowest and an intensity "d" is the highest. Vbatt denotes a voltage outputted when the secondary battery 204 is overcharged.

A graph (A) shows an intensity of the optical signal transmitted by the external data transmission device 10. In the shown example, the optical signal is a signal repeating ON and OFF alternately. That is, the external transmission device 10 turns on the light emitting diode 101 when the device is ON, and turns off the light emitting diode 101 when the device is OFF.

A graph (B) is a graph showing an output voltage of the solar cell 201 when receiving the optical signal transmitted by the external data transmission device 10 in the case where the intensity of ambient light is "a". In the shown example, when the light emitting diode 101 of the external data transmission device 10 is turned on, the output voltage of the solar cell 201 is lower than the threshold Vth. When the light emitting diode 101 of the external data transmission device 10 is turned off, the output voltage of the solar cell 201 is lower than the threshold Vth. Accordingly, when the intensity of ambient light is "a", it is difficult for the electronic timepiece 30 to receive the optical signal transmitted from the external data transmission device 10.

A graph (C) is a graph showing an output voltage of the solar cell 201 when receiving the optical signal transmitted by the external data transmission device 10 in the case where the intensity of ambient light is "b". In the shown example, when the light emitting diode 101 of the external data transmission device 10 is turned on, the output voltage of the solar cell 201 is equal to or higher than the threshold Vth. When the light emitting diode 101 of the external data transmission device 10 is turned off, the output voltage of the solar cell 201 is lower than the threshold Vth. Accordingly, when the intensity of ambient light is "b", the electronic timepiece 30 can receive the optical signal transmitted from the external data transmission device 10.

A graph (D) is a graph showing an output voltage of the solar cell 201 when receiving the optical signal transmitted by the external data transmission device 10 in the case where the intensity of ambient light is "c". In the shown example, when the light emitting diode 101 of the external data transmission device 10 is turned on, the output voltage of the solar cell 201 is equal to or higher than the threshold Vth. When the light emitting diode 101 of the external data transmission device 10 is turned off, the output voltage of the solar cell 201 is lower than the threshold Vth. Accordingly, when the intensity of ambient light is "c", the electronic timepiece 30 can receive the optical signal transmitted from the external data transmission device 10.

A graph (E) is a graph showing an output voltage of the solar cell 201 when receiving the optical signal transmitted by the external data transmission device 10 in the case where the intensity of ambient light is "d". In the shown example, when the light emitting diode 101 of the external data transmission device 10 is turned on, the output voltage of the solar cell 201 is equal to or higher than the threshold Vth. When the light emitting diode 101 of the external data transmission device 10 is turned off, the output voltage of the solar cell 201 is lower than the threshold Vth. Accordingly, when the intensity of ambient light is "d", the electronic timepiece 30 can receive the optical signal transmitted from the external data transmission device 10.

As described above, when the intensity of ambient light is high, the electronic timepiece 30 can receive the optical signal transmitted from the external data transmission device 10 by connecting the resistance 301 and the resistance 302 in parallel between electrodes of the solar cell 201.

When the intensity of ambient light is low, the intensity of light radiated to the solar cell 201 is low when the resistance 301 and the resistance 302 are connected in parallel between electrodes of the solar cell 201, there may be a case where the electronic timepiece 30 is not able to receive the optical signal transmitted from the external data transmission device 10 as shown in the graph (B) of FIG. 7.

Accordingly, in the embodiment, in the case where the output voltage of the solar cell 201 is equal to or higher than the threshold Vth and the state continues for a predetermined period of time or more during operation in the communication mode, the resistance 301 and the resistance 302 are connected in parallel between electrodes of the solar cell 201. That is, in the case where the output voltage of the solar cell 201 is equal to or higher than the threshold Vth and the state continues for a predetermined period of time or more during operation in the communication mode, the resistance value of the resistance to be connected between electrodes of the solar cell 201 is reduced. Accordingly, the electronic timepiece 30 can receive the optical signal transmitted from the external data transmission device 10 regardless of intensity of ambient light.

Figure 8:
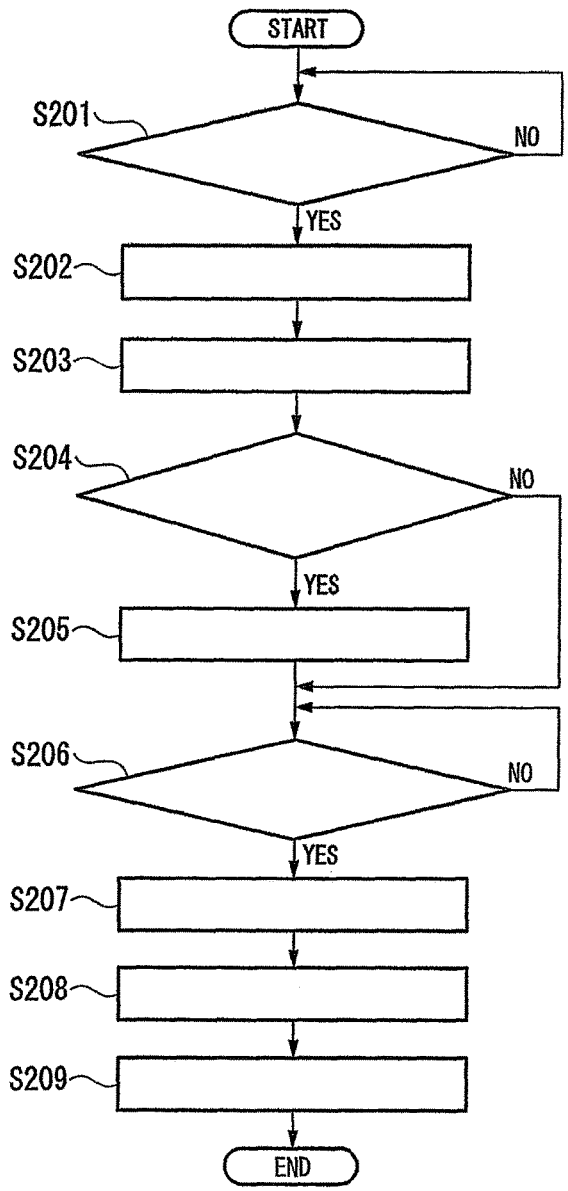
FIG. 8 is a flowchart showing operation procedures of the electronic timepiece according to the second embodiment.

Next, operation procedures of the electronic timepiece 30 will be explained. FIG. 8 is a flowchart showing operation procedures of the electronic timepiece 30 according to the embodiment.

The processes of Step S201 to Step S202 are the same as processes of Step S101 to Step S102 according to the first embodiment.

(Step S203) The control circuit 202 enables a control terminal 1 and turns on the transistor 303. That is, the control circuit 202 connects the resistance 301 between electrodes of the solar cell 201. After that, the process proceeds to Step S204.

(Step S204) The control circuit 202 determines whether the output voltage of the secondary battery 204 is equal to or higher than the threshold Vth as well as the state continues for the predetermined period of time or more or not. When the control circuit 202 determines that the output voltage of the secondary battery 204 is equal to or higher than the threshold Vth as well as the state continues for the predetermined period of time or more, the process proceeds to Step S205. The process proceeds to Step S206 in other cases.

(Step S205) The control circuit 202 enables a control terminal 2 and turns on the transistor 304. That is, the control circuit 202 connects the resistance 302 between electrodes of the solar cell 201. After that, the process proceeds to Step S206.

The processes of Step S206 to Step S208 are the same as the processes of Step S104 to Step S106 according to the first embodiment.

(Step S209) The control circuit 202 disables the control terminals 1, 2 and turns off the transistors 303, 304. That is, the control circuit 202 cuts off the connection of the resistances 301, 302 between electrodes of the solar cell 201. After that, the process ends.

As described above, according to the embodiment, the electronic timepiece 30 operates in the communication mode in which reception of data transmitted from the external data transmission device 10 by optical communication is performed and in the normal mode in which reception of data is not performed. The control circuit 202 cuts off the connection of the resistances 301 and 302 between electrodes of the solar cell 201 when operating in the normal mode. The control circuit 202 connects the resistance 301 between electrodes of the solar cell 201 when operating in the communication mode. In the case where the output voltage of the solar cell 210 is equal to or higher than the threshold Vth as well as the state continues for the predetermined period of time or more even when the resistance 301 is connected between electrodes of the solar cell 201, the resistance 301 and the resistance 302 are connected in parallel between electrodes of the solar cell 201.

Accordingly, the electronic timepiece 30 detects the output voltage of the solar cell 201 inputted into the input terminal and converts the detected voltage into an electrical signal to thereby receive data transmitted from the external data transmission device 10 by optical communication regardless of effects of ambient light at the time of operating in the communication mode. The electronic timepiece 30 can charge the secondary battery 204 by ambient light at the time of operating in the normal mode. That is, the electronic timepiece 30 can charge the secondary battery 204 and perform data communication using the solar cell 201 while suppressing effects of ambient light even when the intensity of light radiated to the solar cell 201 is low.

In the embodiment, the example in which two resistances 301 and 302 are connected in parallel for changing the resistance value of the resistance connected between electrodes of the solar cell 201 is shown, however, the invention is not limited to this. For example, it is also preferable to connect three or more resistances between electrodes of the solar cell 201. The resistances may be connected in series, not limited to the connection in parallel. A variable resistance may be used as the resistance.

The entire or part of functions of respective components included in the electronic apparatus 20 or the electronic timepiece 30 according to the embodiments may be realized by recording a program for realizing these functions in computer-readable recording media, allowing the program recorded in the recording media to be read by a computer system and executing the program. The computer system in this case includes hardware such as OS and peripheral devices.

The "computer-readable recording media" include removable media such as a flexible disk, a magneto-optical disk, a ROM, and a CD-ROM, and storage units such as a hard disk built in the computer system. The "computer-readable recording media" may further include media dynamically holding the program for a short period of time such as communication lines used when transmitting the program through the communication lines such as networks including Internet and a telephone line as well as include media holding the program for a fixed period of time such as a server used in the above and a nonvolatile memory inside the computer system to be a client. The program may be one for realizing part of the above functions and may be one for realizing the above functions in combination of a program already recorded in the computer system.

The first embodiment and the second embodiment have been explained as the above, however, the invention is not limited to the above embodiments and various alterations may occur within a scope not departing from the gist of the invention.

For example, the electronic timepieces 20 and 30 have been explained as examples of electronic apparatuses in the above embodiment, however, the invention is not limited to them, and may be applied to any apparatus having the solar cell. Furthermore, for example, the connection of the resistances 205, 301 and 302 connected between electrodes of the solar cell 201 is controlled by turning ON/OFF the transistors 206, 303 and 304, however, the invention is not limited to this, and may be controlled by any method such as by a switch. The light source used for transmitting the optical signal by the external data transmission device 10 is not limited to the light emitting diode 101 and any light source may be used as long as one which can be turned on and off.

REFERENCE SIGNS LIST

1 . . . data communication system, 10 . . . external data transmission device, 20, 30 . . . electronic timepiece, 101 . . . light emitting diode, 201 . . . solar cell, 202 . . . control circuit, 203 . . . charge control circuit, 204 . . . secondary battery, 205, 301, 302, 2032, 2033 . . . resistance, 206, 303, 304, 2036 . . . transistor, 207 . . . external input unit, 208 . . . display unit, 2031 . . . diode device, 2034 . . . reference voltage circuit, 2035 . . . comparator unit

The invention claimed is:

1. An electronic apparatus comprising:
    a solar cell that generates a charge and produces an output voltage in response to received light;
    a receiving unit operable while the solar cell is generating a charge in both a communication mode for receiving data based on an output voltage of the solar cell and a non-communication mode;
    a resistance connected between electrodes of the solar cell;
    a charge control circuit configured to limit the output voltage from the solar cell to an upper-limit value; and
    a controller for controlling a resistance value of the resistance based on whether the receiving unit is operating in the communication mode of receiving the data or not, the controller being configured to be inputted the data within the upper-limit value, and the controller being configured to process the data.

2. The electronic apparatus according to claim 1, wherein the controller cuts off connection of the resistance when the receiving unit is not operating in the communication mode of receiving data.

3. The electronic apparatus according to claim 1, wherein the controller controls the resistance value of the resistance in accordance with the output voltage of the solar cell.

4. The electronic apparatus according to claim 3, wherein the controller reduces the resistance value of the resistance in the case where the output voltage of the solar cell is equal to or higher than a fixed value for a predetermined period of time or more.

5. A control method comprising the steps of:
    receiving data based on an output voltage of a solar cell;
    limiting the output voltage from the solar cell to an upper-limit value;
    controlling a resistance value of a resistance connected between electrodes of the solar cell to be a higher value when the data is being received in the receiving step and to be a lower value when the data is not being received in the receiving step; and
    processing the received data within the upper-limit value.

6. An electronic apparatus comprising:
    a solar cell that generates a charge and produces an output voltage which varies according to the amount of received light;
    a resistance connected between electrodes of the solar cell;
    a charge control circuit configured to limit the output voltage of the solar cell to an upper-limit value; and
    a controller operable while the solar cell is generating a charge in both a communication mode for receiving information data based on the output voltage of the solar cell and n a non-communication mode, the controller being configured to control a resistance value of the resistance to enable the controller, when operating in the communication mode, to receive the information data within the upper-limit value and process the information data.

7. The electronic apparatus according to claim 6; wherein the controller cuts off connection of the resistance when the controller is not operating in the communication mode.

8. The electronic apparatus according to claim 6; wherein the controller controls the resistance value of the resistance in accordance with the output voltage of the solar cell.

9. The electronic apparatus according to claim 6; wherein the controller reduces the resistance value of the resistance in the case where the output voltage of the solar cell is equal to or higher than a fixed value for a predetermined period of time or more.

10. The electronic apparatus according to claim 6; wherein the electrodes of the solar cell comprise positive and negative terminals of the solar cell.

11. The electronic apparatus according to claim 10; wherein the controller has an input terminal connected to a node of one terminal of the solar cell and one end of the resistance.

12. The electronic apparatus according to claim 6; wherein the solar cell is connected through the charge control circuit to a secondary battery for charging the secondary battery in a non-communication charging mode of operation of the controller.

13. The electronic apparatus according to claim 12; wherein the controller cuts off connection of the resistance when operating in the non-communication charging mode.

14. The electronic apparatus according to claim 12; wherein the electronic apparatus comprises an electronic timepiece.

15. The electronic apparatus according to claim 6; wherein the electronic apparatus comprises an electronic timepiece.

\* \* \* \* \*